United States Patent
Reich (10) Patent No.: US 9,946,686 B2
(45) Date of Patent: Apr. 17, 2018

(54) MEASURING DEVICE AND A METHOD FOR THE DECIMATION OF A DATASTREAM

(75) Inventor: Friedrich Reich, Stadtbergen (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 795 days.

(21) Appl. No.: 13/805,782

(22) PCT Filed: Jun. 1, 2011

(86) PCT No.: PCT/EP2011/059074
§ 371 (c)(1),
(2), (4) Date: Mar. 15, 2013

(87) PCT Pub. No.: WO2011/160931
PCT Pub. Date: Dec. 29, 2011

(65) Prior Publication Data
US 2013/0197865 A1 Aug. 1, 2013

(30) Foreign Application Priority Data

Jun. 23, 2010 (DE) .................. 10 2010 024 707
Sep. 24, 2010 (DE) .................. 10 2010 046 437

(51) Int. Cl.
*G01R 13/00* (2006.01)
*G06F 17/00* (2006.01)
*G01R 19/02* (2006.01)
*G01R 13/02* (2006.01)

(52) U.S. Cl.
CPC .......... *G06F 17/00* (2013.01); *G01R 13/0218* (2013.01); *G01R 19/02* (2013.01)

(58) Field of Classification Search
CPC .............................. G01R 13/0218; G01R 19/02
See application file for complete search history.

(56) References Cited

U.S. PATENT DOCUMENTS 4,344,142 A * 8/1982 Diehr, II ............ B29C 35/0288
264/325
5,930,745 A * 7/1999 Swift ................. G01R 19/2509
327/100

(Continued)

FOREIGN PATENT DOCUMENTS

DE 10 2007 018 095 A1 6/2008
DE 10 2007 053401 A1 5/2009

(Continued)

OTHER PUBLICATIONS

Florian, DE 10 2007 053 401 (Machine translated English version).*
Supreme Court Decision (*Alice* vs *CLS Bank*) (2013).*
Harris et al., "16-channel PC-based aircraft electrical power monitor", Proceedings of the Instrumentation and Measurement Technology Conference, May 1993, XP010131406, pp. 637-642.
Wang et al., "Identifying Gravel Layer Using Time-Domain Analysis Methods for Landfill Leak Repair", Measuring Technology and Mechatronics Automation (ICMTMA), Mar. 2010, pp. 406-409, XP031672043.

(Continued)

*Primary Examiner* — Hyun Park
(74) *Attorney, Agent, or Firm* — Carter, Deluca, Farrell & Schmidt, LLP (57) ABSTRACT

A measuring device for an oscilloscope provides a decimation unit. The decimation unit provides at least one input, which receives a datastream with a plurality of sampled values from at least one data source. The decimation unit also has at least one output, at which a reduced datastream is output. The reduced datastream is formed from a root-mean-squared value of respectively at least two sampled values calculated by the decimation unit.

16 Claims, 3 Drawing Sheets

(56) References Cited

U.S. PATENT DOCUMENTS

| | | | | |
|---|---|---|---|---|
| 6,064,193 A * | 5/2000 | Hansen | ............... | G01R 19/02 |
| | | | | 324/119 |
| 6,380,874 B1 | 4/2002 | Knudsen | | |
| 7,071,852 B1 * | 7/2006 | Wegener | ............ | G01R 13/02 |
| | | | | 341/144 |
| 7,203,229 B1 * | 4/2007 | Ishida | ............... | G01R 29/26 |
| | | | | 375/226 |
| 2003/0110194 A1 | 6/2003 | Gorbics et al. | | |
| 2009/0281758 A1 | 11/2009 | Cake et al. | | |
| 2010/0057388 A1 * | 3/2010 | LeBrun | ............ | G01R 13/0218 |
| | | | | 702/67 |

FOREIGN PATENT DOCUMENTS

| | | |
|---|---|---|
| EP | 0 892 272 A2 | 1/1999 |
| EP | 0 916 956 A1 | 5/1999 |
| EP | 0 977 043 A1 | 2/2000 |
| EP | 1 837 664 A1 | 9/2007 |
| EP | 2 096 451 A1 | 9/2009 |
| WO | 2005/101032 A1 | 10/2005 |

OTHER PUBLICATIONS

International Search Report for corresponding application No. PCT/EP2011/059074 dated Sep. 1, 2011.

* cited by examiner

MEASURING DEVICE AND A METHOD FOR THE DECIMATION OF A DATASTREAM

The invention relates to a measuring device and a method for the decimation of sampled values in an oscilloscope.

In oscilloscopes, the time basis (scaling of the time axis) can be adjusted within a broad range from, for example, 20 ps/division to 50 s/division. In the case of digital oscilloscopes, the time basis determines the length of time for which the signal must be recorded. Furthermore, in digital oscilloscopes, the analog digital conversion of the sampled values is preferably implemented at a constant, non-variable rate of the analog/digital converter. The rate of the analog/digital converter in this context is based on the maximum sampling rate of the corresponding oscilloscope. As a result of the broad range covered by the time basis, it is not always possible to record at the full sampling rate of the analog digital converter. For example, if the rate of the analog/digital converter is 10 Gsample/s, and if the time basis is set to is/div, and if the screen unit of the oscilloscope can display 10 divisions, 100 Gsamples would have to be recorded, stored and processed. Such rapid and large memories, and the necessary signal processing for this purpose, are either technically not realisable or unreasonably costly, especially since the screen unit does not provide the necessary resolution in order to display several million sampled values anyway.

For this reason, with digital oscilloscopes, dependent upon the scaling of the time axis, every sampled value is no longer necessarily stored and displayed, but the sampled values are decimated before storage. Various methods from the prior art are known for this purpose.

A method and a device with which it is possible to decimate a datastream simultaneously with several types of decimation are known from DE 10 2007 053 401 A1. In this context, the types of decimation presented are selection decimation, mean-value decimation and maximum-value decimation. If the sampled values are to be decimated using selection decimation, for example, by the factor 1000, a sampled value is selected randomly, from a time portion of 1000 sampled values, and the remaining sampled values are rejected. In the case of a mean-value decimation, the mean value is formed from a time portion of 1000 sampled values and stored; whereas, in the case of a maximum-value decimation, only the minimum value and the maximum value from the time portion of 1000 sampled values are stored. The disadvantage with DE 10 2007 053 401 A1 is that none of the decimation methods used allows an effective value of a preferably periodic signal to be calculated very accurately and displayed.

The object of the present invention is therefore to provide a measuring device and a method, which allow the effective value of a signal to be displayed very accurately.

The object is achieved with regard to the measuring device by the features of claim 1 and with regard to the method by the features of claim 8. Advantageous further developments of the measuring device according to the invention and the method according to the invention are specified in the dependent claims.

The measuring device according to the invention, especially for an oscilloscope, provides a decimation unit, wherein the decimation unit provides at least one input, which receives a datastream with a plurality of sampled values from at least one data source. The decimation unit provides an output, at which a reduced datastream is output, wherein the reduced datastream is formed from a root-mean-squared value of respectively at least two sampled values calculated by the decimation unit.

It is particularly advantageous if the measuring device calculates from at least two sampled values of the datastream, a reduced datastream which contains a mean-squared value of the at least two sampled values. Accordingly, the effective value of a preferably periodic signal can be displayed directly and very accurately. This is of enormous importance, for example, for the analysis of power-supply units or high-frequency output units. The formation of a mean-squared value is also understood to mean the formation of a root-mean-squared value (English: root mean square).

The method according to the invention for the decimation of a datastream, especially for an oscilloscope, provides a decimation unit, of which the at least one input receives the datastream with a plurality of sampled values from at least one data source, and at the output of which, a reduced datastream is output. Parameters, such as the time range and/or the voltage range, are adjusted in a first method step. In a second method step, the reduced datastream is formed from a root-mean-squared value of respectively at least two sampled values calculated by the decimation unit.

A special advantage is achieved if the method calculates from at least two sampled values of the datastream a reduced datastream which contains a mean-squared value of the at least two sampled values. Accordingly, in the analysis of modulated signals, for example, amplitude-modulated signals, a considerable advantage is achieved, because the modulation signal can be visualised directly by slowing down the time basis. A further advantage of the measuring device according to the invention is achieved if adjusted values for an offset are taken into consideration by the decimation unit in the calculation of the root-mean-squared value. As a result, for example, a steady component within a preferably periodic signal can be eliminated.

Finally, an advantage is achieved with the method according to the invention if several data sources which each supply a plurality of sampled values are connected to the decimation unit, and if the decimation unit calculates a root-mean-squared value respectively from at least two sampled values of each data source in parallel. This allows, for example, the parallel decimation of sampled values from different channels through the formation of the root-mean-squared value. In this manner, for example, the effective value of a preferably periodic signal can be measured at different positions within the circuit to be analysed at the same time.

Different exemplary embodiments of the invention are described by way of example below with reference to the drawings. Identical subject matters are shown with the same reference numbers. In detail, the corresponding figures in the drawings are as follows.

Figure 1:
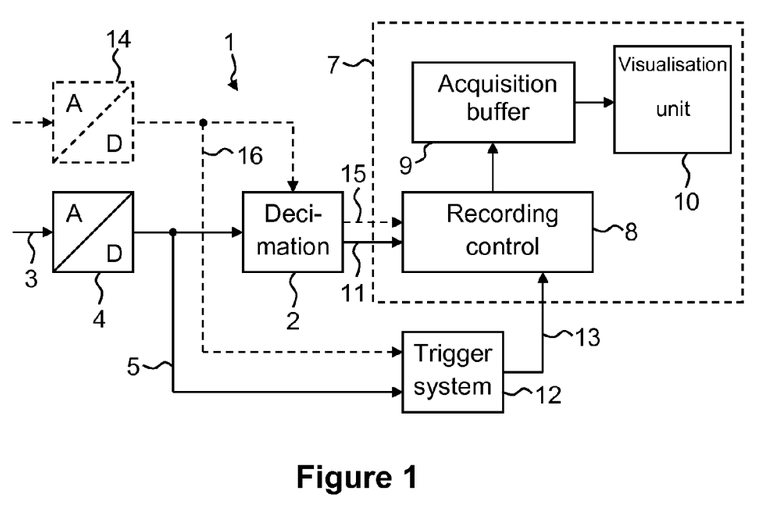
FIG. 1 shows a block-circuit diagram of an exemplary embodiment of the measuring device, which contains the decimation unit according to the invention.

An exemplary embodiment of the measuring device 1 with the decimation unit 2 according to the invention is shown in FIG. 1 and will be described in greater detail below.

An analog test signal 3 is converted in an analog/digital converter 4 into the corresponding data format. The analog/digital converter 4 is also referred to as a data source 4. The data source 4 supplies a digital datastream 5 at its output. This datastream contains a plurality of sampled values. The datastream 5 is received by the decimation unit 2 at its at least one input. Optionally, an equalising filter, in which an equalisation of the linear or non-linear distorted datastream 5 is implemented, can also be connected between the data source 4 and the decimation unit 2.

The datastream 5 can be a digitised voltage characteristic or a digitised current characteristic of the analog test signal 3.

An output of the decimation unit 2 is connected to a recording unit 7. A recording control 8, an acquisition buffer 9 and a visualisation unit 10 are embodied within the recording unit 7. The recording control 8 is accordingly connected to at least one output of the decimation unit 2. The recording control 8 receives a reduced datastream 11 via this output of the decimation unit 2. The reduced datastream 11 is formed from a root-mean-squared value of respectively at least two sampled values from the datastream 5 calculated by the decimation unit 2. A detailed explanation of how this calculation is performed is provided later in the description.

The datastream 5 with a plurality of sampled values is also supplied to the input of a trigger unit 12. An output of the trigger unit 12 is connected to the recording unit 7 and within the latter to the recording control 8. In the trigger unit 12, the datastream 5 with a plurality of sampled values is compared with adjustable threshold values in order to generate a trigger signal 13. The trigger signal 13 is then rerouted via a data connection to the recording unit 7 and within the latter to the recording control 8.

The recording control 8 also contains a ring buffer, which is not illustrated, in which the reduced datastream 11 is stored. As soon as the recording control 8 has received the trigger signal 13 from the trigger unit 12 via the recording unit 7, the sampled values which are stored within the recording control 8 in the ring buffer, which is not illustrated, are stored in the acquisition buffer 9 of the recording unit 7 by the recording control 8 within the recording unit 7. The precise selection of which sampled values should be stored in the acquisition buffer 9 depends, inter alia, upon the selected position of the trigger time.

The acquisition buffer 9 in the recording unit 7 is connected to the visualisation unit 10. On a screen unit, which is not illustrated, the visualisation unit 10 displays the plurality of sampled values from the reduced datastream 11 selected by the recording control 8 in the recording unit 7. In this context, it is significant that the non-decimated datastream 5 is supplied to the trigger unit 12, and that the recording control 8 receives only a decimated datastream 11 from the decimation unit 2 via the recording unit 7. A low-pass filter can optionally also be embodied between the data source 4 and the trigger unit 12, which band-limits a noise signal of higher frequency than the datastream 5.

By preference, the decimation unit 2 provides further data sources 14. These further data sources 14 are preferably also analog/digital converters, which are connected to the further input channels of the measuring device 1, which is preferably an oscilloscope. This further data source 14 is represented by dotted lines in order to express the fact that an indefinite number of individual data sources 14 can be provided. The further data source 14 is connected to a further input of the trigger unit 12 and to a further input of the decimation unit 2. The further data sources 14, which are connected to the decimation unit 2, each supply a plurality of sampled values to the latter. The decimation unit 2 calculates a root-mean-squared value from respectively at least two sampled values of the further data source 14. This calculation is preferably implemented in parallel for all data sources 4, 14. The decimation unit 2 provides a dedicated output for each data source 4, 14, wherein a reduced datastream 11, 15 for each data source 4, 14 is provided at every output and transferred to the recording control 8 via the recording unit 7.

The trigger unit 12 compares a plurality of sampled values for every data source 4, 14 with a threshold value which is individually adjustable for each data source 4, 14. As soon as a datastream 5, 16 exceeds a threshold value set for it, the trigger unit 12 outputs the trigger signal 13 to the recording control 8 via the recording unit 7. In this context, the trigger unit 12 can also use a dedicated trigger type for each data source 4, 14. For example, one data source 4 can be triggered on a rising edge, another data source 14 can be triggered on a falling edge, and yet another data source 14 can be triggered, for example, on a given bit pattern or on a given pulse width.

Figure 2:
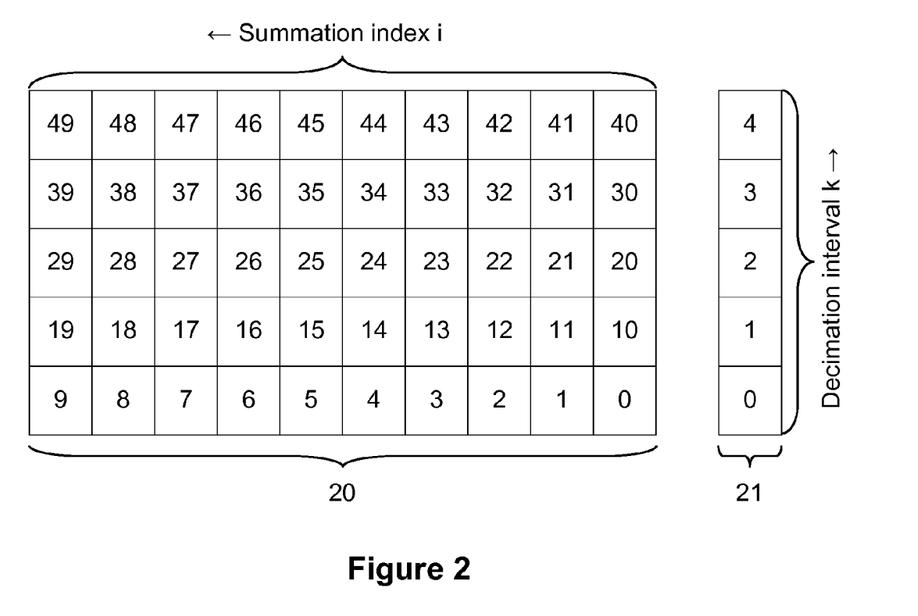
FIG. 2 shows a table with exemplary sampled values by way of explanation of the method of functioning of the decimation unit according to the invention.

FIG. 2 shows a table with exemplary sampled values by way of explanation of the method of functioning of the decimation unit 2 according to the invention. Accordingly, the decimation unit 2 reduces the datastream 5 by a decimation factor D and outputs a datastream 11 reduced by the decimation factor at its output. With modern oscilloscopes, the rate of the data source 4 is set to be constant, preferably at its fastest value, so that it can be guaranteed that the trigger unit 12 recognises the position within the test signal to be triggered in the optimum manner. If a data source 4 supplies a datastream 5 with a data rate of, for example, 10 Gsamples/s, a test value will be recorded every 100 ps. If a screen unit connected to the visualisation unit 10 provides a resolution of, for example, 1000 pixels in the horizontal direction, a maximum of 1000 sampled values can be displayed simultaneously with the previously set data rate of the data source 4. This corresponds to a time range of 100 ns. Now, if it is necessary to consider a time period of 1 µs, only every 10th sampled value can be shown. The plurality of sampled values supplied by the data source 4 must now be decimated or reduced in the decimation unit 2 by the decimation factor D=10.

In FIG. 2, the values of fifty sampled values are shown in a first table 20, by way of example. The first sampled value shows the value zero; the 50th sampled value shows the value 49. This plurality of sampled values should now be decimated according to the decimation method of the invention. Table 20 shows five rows with ten columns each. A second table 21, also shows five rows with only one column. The second table 21 contains the decimation interval k. The decimation unit 2 according to the invention preferably operates according to equation (1):

$$u_{RMS}(k) = \sqrt{\frac{1}{D}\sum_{i=0}^{D-1}(u(k \cdot D + i))^2} \qquad (1)$$

wherein the mean-squared value (English: root mean squared (RMS)) is calculated with:
D=decimation factor
k=decimation interval
u=sampled value
i=summation index.

In the above example, the plurality of sampled values should be decimated by the decimation factor D=10. Each row of Table 20 in FIG. 2 already contains 10 sampled values from which the root-mean-squared value is formed in each case. In equation (1), the individual rows of Table 20 are addressed via the decimation interval k, starting with zero. The decimation interval k is plotted in Table 21 only by way of explanation. The summation index i, which is also referred to as the running index i, is used in order to address the individual sampled values accurately within each decimation interval k. For the first row in Table 20, the root-mean-squared value is calculated according to equation (2):

$$u_{RMS} = \sqrt{\frac{1}{10} \cdot (0^2 + 1^2 + 2^2 + 3^2 + 4^2 + 5^2 + 6^2 + 7^2 + 8^2 + 9^2)} \quad (2)$$

as $$u_{RMS} \sim 5.34. \quad (3)$$

The other decimation intervals k are calculated in an analogous manner.

The reduced datastream 11 at the output of the decimation unit 2 finally contains only five sampled values instead of the original fifty sampled values, which are stored in the ring buffer of the recording control 8. As soon as the trigger unit 12, which compares all fifty sampled values of the datastream 5 with an adjustable trigger criterion, outputs a trigger signal 13 via the recording unit 7 to the recording control 8, the recording control 8 buffers the reduced datastream 11 disposed in its ring buffer in the acquisition buffer 9. A screen unit connected to the visualisation unit 10 displays the reduced datastream 11 stored in the acquisition buffer 9. Accordingly, the decimated sampled value 5.34 can be displayed, for example, on the vertical region of the first pixel.

If the analog test signal 3 is associated with an offset value $v_{off}$, this offset value $v_{off}$ can be taken into consideration in the decimation unit 2. A formula for the formation of the root-mean-squared value taking into consideration the offset value $v_{off}$ is specified in equation (4):

$$u_{RMS}(k) = \sqrt{\frac{1}{D} \sum_{i=0}^{D-1} (u(k \cdot D + i + v_{off}))^2}. \quad (4)$$

The offset value $v_{off}$ in this context is added directly to each sampled value.

In a further exemplary embodiment according to the invention, the root-mean-squared value is formed by the decimation unit 2 not from every sampled value in the decimation interval k, but in such a manner that only every n-th sampled value is included in the formation of the root-mean-squared value. A formula for this purpose is indicated in equation (5):

$$u_{RMS}(k) = \sqrt{\frac{1}{D} \sum_{i=0}^{\frac{D-1}{n}} (u(k \cdot D + n \cdot i))^2} \quad (5)$$

with $$\frac{D-1}{n} \in \mathbb{N} \cap n > 1.$$

In this case, n is a so-called small decimation factor.

This kind of decimation can be used meaningfully especially if the variance of the sampled values of the datastream 5 is low. Accordingly, the necessary computational power of the decimation unit 2 can be reduced, or a less powerful decimation unit 2 with regard to computational power can decimate a plurality of datastreams 5, 14 in parallel.

It is, of course, also possible for any offset values $v_{off}$ to be taken into consideration in equation (5). For this purpose, the offset values $v_{off}$ in equation (5) are added to equation (4) as before.

In a further exemplary embodiment according to the invention, the root-mean-squared value is formed within a decimation interval k only from the maximum and minimum sampled values which are contained within the decimation interval k.

Figure 3:
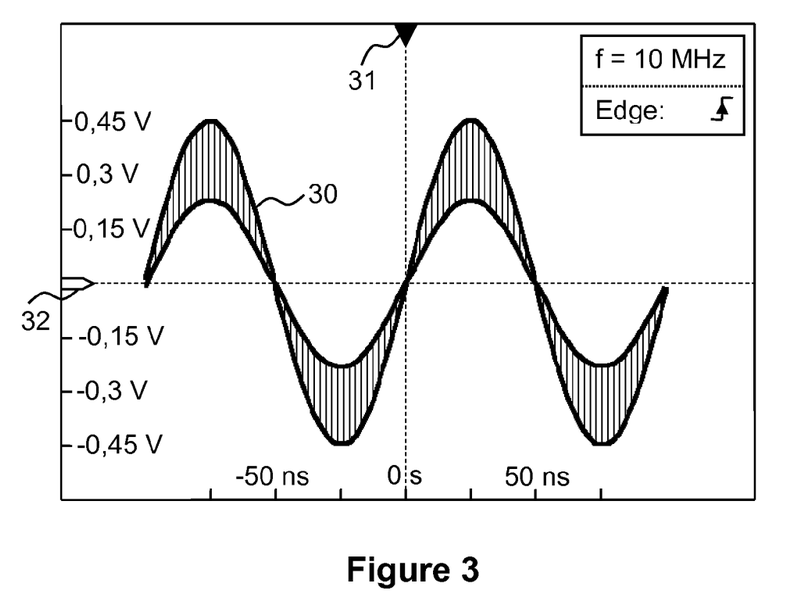
FIG. 3 shows a screenshot with an exemplary amplitude-modulated signal by way of explanation of the decimation unit according to the invention.

FIG. 3 shows a screenshot with an exemplary amplitude-modulated signal 30 by way of explanation of the decimation unit 2 according to the invention. The amplitude-modulated signal 30 illustrated provides a frequency in the example of 10 MHz. In this context, the period is 100 ns. The cursor for the trigger time 31 is disposed in the middle of the screenshot, and the cursor for the trigger threshold 32 is at 0 V. The trigger unit 12 triggers on a rising edge of the amplitude-modulated signal 30. The time range is scaled in such a manner that it covers approximately a range of 200 ns. The decimation unit 2 is switched off during the recording of the screen shot, which means that the screen unit provides, for example, a resolution of 2000 pixels on the horizontal, with a data rate of the data source of 10 Gsamples/s. The high-frequency of the modulation signal of 1 kHz and the slow image-refresh rate of the screen unit lead to the appearance of so-called shadows. The screenshot shows the amplitude-modulated signal 30 sometimes with the maximum and sometimes with the minimum amplitude.

In order to demodulate such an amplitude-modulated signal 30, in the simplest case, a rectification by means of a diode and smoothing by means of a charging capacitor are necessary. A discharge resistor is generally also arranged in parallel with the charging capacitor, wherein the time constant of the combination of charging capacitor and discharge resistor must be greater than the period of the high-frequency carrier, and must be less than the period of the modulation signal. When considering the formula for forming the root-mean-squared value from equation (1), it must be established that the rectification is implemented by squaring and subsequent formation of the root. The smoothing itself is implemented through the formation of the mean-value, so that a demodulation of an amplitude-modulated signal 30 is possible only through the use of a decimation unit 2, which forms the root-mean-squared value. This demodulation takes place automatically when the decimation unit 2 according to the invention is used, as explained in FIG. 4.

Figure 4:
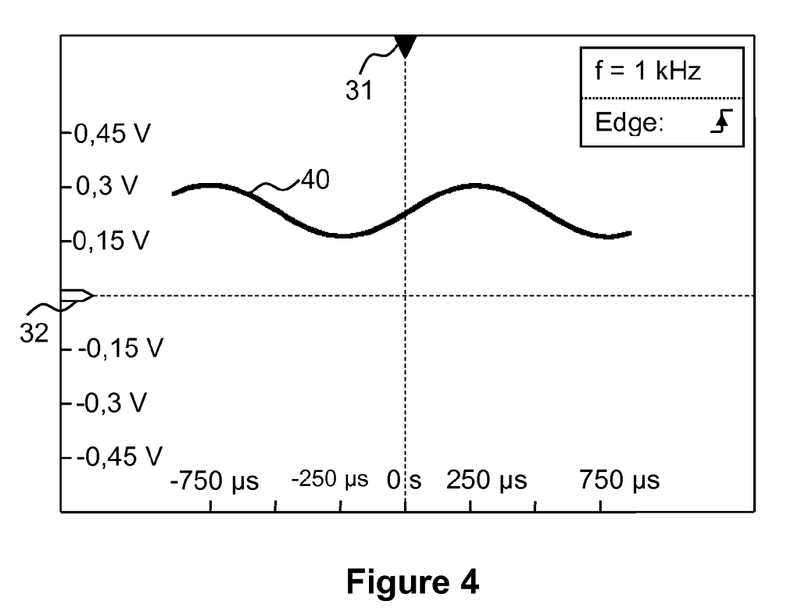
FIG. 4 shows a further screenshot with a modulation signal by way of explanation of the decimation unit according to the invention.

FIG. 4 shows a further screenshot with a modulation signal 40 by way of explanation of the decimation unit 2 according to the invention. The time axis in FIG. 4 is scaled upwards by the factor 10,000 by comparison with the time axis from FIG. 3. Instead of a total time range 200 ns, the time axis from FIG. 4 specifies a total time range of 2 ms. In this case, the decimation factor D is 10,000. The scaling of the voltage range is unchanged. The modulation signal 40, with which the carrier signal was modulated, is evident. This modulation signal 40 is preferably a periodic signal with a frequency of 1 kHz. However, the signal need not necessarily be periodic. Amplitude-modulated signals, for example, are generally not periodic. The demodulation occurs through displacement of the time range and, in fact, to the extent that the selected time range is disposed between the period of the high-frequency carrier and the period of the modulation signal 40. With conventional oscilloscopes, this time range can be adjusted very simply and rapidly. If the time range is selected to be small, the displayed signal is only the rectified, amplitude-modulated signal 30. If the time range is selected to be too large, the modulation signal 40 is too strongly smoothed and, under some circumstances, represents only a horizontal line.

Figure 5:
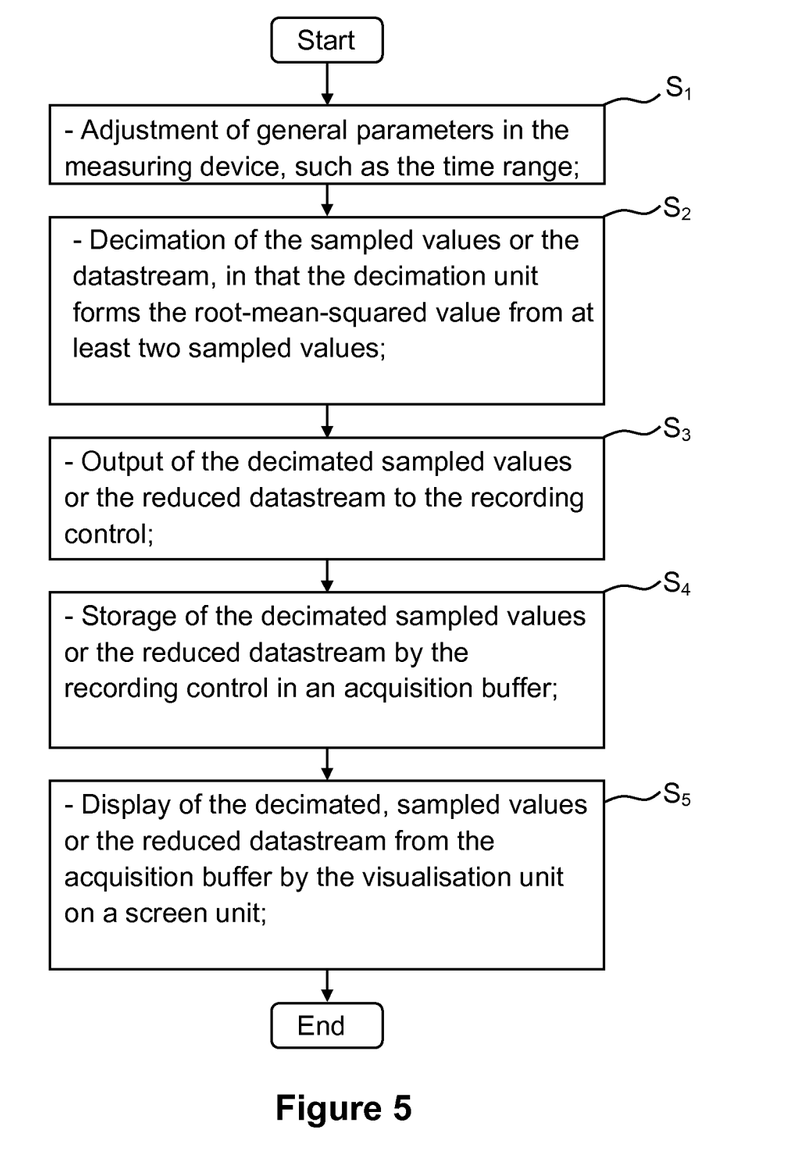
FIG. 5 shows a flow chart by way of explanation of an exemplary embodiment of the method according to the invention for the decimation of sampled values.

FIG. 5 shows a flow chart by way of explanation of an exemplary embodiment of the method according to the invention for the decimation of sampled values. At one input at least, the decimation unit 2 receives a datastream 5, which contains a plurality of sampled values from at least one data source 4. Accordingly, at least one reduced datastream 11 is output at the output of the decimation unit 2.

In a first method step $S_1$, basic parameters of the measuring device 1, which is preferably an oscilloscope, are set. Accordingly, general parameters, such as the time range and/or the level range, for example, the voltage range or current range, and/or the trigger threshold and/or the trigger time and/or the type of trigger to which the trigger unit 8 responds, and/or the channel to be measured and/or the terminal resistance at the test input, are adjusted in this context. The adjustment of the terminal resistance here is necessary for the purpose of calculating the power. Accordingly, the effective value of an analog test signal 3 can also be displayed via the time. The adjustment can be implemented in an automated manner, for example, by a computer system connected to the measuring device 1.

In a second method step $S_2$, a reduced datastream 11 is formed from a root-mean-squared value of respectively at least two sampled values calculated by the decimation unit 2. It can also be said that the sampled values are reduced, for which purpose at least two sampled values are necessary, from which a common, root-mean-squared value is formed. The formation of the root-mean-squared value is implemented according to one of the equations (1), (2) or (3), wherein an offset value $v_{off}$ can also be taken into consideration in equation (3). In this context, the decimation factor D is determined according to the data rate of the data source 4, the size of the acquisition buffer 9 and the scaling of the time range or according to the maximum number of pixels displayable on the screen unit. Accordingly, the faster the data rate of the data source 4, the smaller the acquisition buffer 9, and the larger the time range, the larger the decimation factor D must be selected to be.

In a further method step $S_3$, the reduced datastream 11 is output at an output of the decimation unit 2 to the recording control 8 via the recording unit 7, and buffered within the latter in a ring buffer. In this context, the reduced datastream 11 comprises the sampled values decimated with the decimation factor D.

In a fourth method step $S_4$, the reduced datastream 11 is buffered by the recording control 8 in an acquisition buffer 9, as soon as the trigger unit 12 outputs a trigger signal 13 to the recording control 8 via the recording unit 7. The reduced datastream 11 to be buffered also comprises the decimated sampled values. By preference, only so many sampled values are stored as can be displayed by the screen unit. If the acquisition buffer is large enough, more sampled values can also be stored than can be displayed by the screen unit. In this case, the observation time can be changed, or a time axis can be re-scaled, without needing to re-register the sampled values.

In a fifth method step $S_5$, the reduced datastream 11 stored in the acquisition buffer 9 is displayed by the visualisation unit 10 on a screen unit. The reduced datastream 11 also comprises the decimated sampled values.

The datastream 5 with its plurality of sampled values can relate both to a measured voltage and also to a measured current and also to another physical value. The offset value $v_{off}$ can be an offset voltage or an offset current or the offset (German: Versatz) of another physical value and can be adjusted arbitrarily. This adjustment is preferably implemented by a computer system connected to the measuring device 1.

Furthermore, it is possible for further data sources 14, each individual one of which supplies a plurality of sampled values to the decimation unit 2, to be connected to the latter. The decimation unit 2 then forms a root-mean-squared value from at least two sampled values of each data source 14, wherein the root-mean-squared values for each of the further data sources 14 are preferably calculated in parallel with one another. A serial calculation of the root-mean-squared values is also possible.

Within the framework of the invention, all of the features described and/or illustrated can be combined with one another as required. The decimation by formation of a root-mean-squared value from a plurality of sampled values can also be used in measuring devices other than an oscilloscope.

Moreover, the decimation need not only be used on a datastream 5, 16 coming from an analog/digital converter, but can be used on any arbitrary, digital datastream.

With very fast data rates, the datastream 5, 16 coming from the analog/digital converter can also be stored directly in the acquisition buffer unit 9. The decimation is then implemented after the completion of the recording phase.

It is also possible for different types of decimation to be implemented in parallel on a datastream 5, 16. In this case, the datastream 11, 15 at the output of the decimation unit 2 is not a reduced datastream. The word width of the datastream 11, 15 at the output of the decimation unit 2 can then be larger than in the case of the datastream 5, 16 at the input of the decimation unit 2. Accordingly, the object of the decimation unit 2 is not the reduction of data within the datastream 5, 16 for the purpose of reducing the re-processing cost, but the simultaneous display of different information of the datastream 5, 16, such as the effective value over time and, in parallel with this, for example, the peak value (German: Scheitelwert).

The invention claimed is:

1. An oscilloscope, comprising:
   a plurality of analog/digital converters each measuring periodic signal values at different positions in a circuit;
   a decimation unit that includes a plurality of inputs, each of the plurality of inputs receiving a datastream with a plurality of sampled values from the plurality of analog/digital converters, and includes a plurality of outputs corresponding to the plurality of inputs, each of the plurality of outputs outputting a reduced datastream corresponding to one of the plurality of analog/digital converters, the decimation unit being configured to:
   calculate a root-mean-squared value in parallel from respectively at least two sampled values of each of the plurality of datastreams, and form each of the plurality of reduced datastreams from the root-mean-squared values;
an equalising filter connected between at least one of the plurality of analog/digital converters and the decimation unit, the equalising filter being configured to equalise each of the plurality of datastreams;
a recording unit configured to receive the plurality of reduced data streams, the recording unit including a visualisation unit that displays at least a portion of the plurality of reduced datastreams on a screen unit of the oscilloscope;
a trigger unit that compares the plurality of sampled values received from each of the plurality of analog/digital converters with a threshold value adjusted individually for each of the plurality of analog/digital converters, the trigger unit being configured to:
output a trigger signal to the recording unit when the trigger unit determines that a sampled value exceeds a corresponding threshold value,
wherein the screen unit displays the plurality of reduced datastreams based on the trigger signal; and
a low-pass filter connected between at least one of the plurality of analog/digital converters and the trigger unit, the low-pass filter being configured to band-limit a noise signal having a higher frequency than the plurality of datastreams,
wherein the decimation unit is configured to slow down a time basis so that the plurality of reduced datastreams can be directly visualised on the screen unit, and
wherein the decimation unit calculates the root-mean-squared values $u_{RMS}$ according to the formula:

$$u_{RMS}(k) = \sqrt{\frac{1}{D}\sum_{i=0}^{D-1}(u(k \cdot D + i))^2},$$

wherein
D=decimation factor,
k=decimation interval,
u=sampled value, and
i=summation index.

2. The oscilloscope according to claim 1, wherein the decimation unit takes into consideration adjusted values for an offset in the calculation of the root-mean-squared values.

3. The oscilloscope according to claim 1, wherein each of the plurality of datastreams reproduces a voltage characteristic or a current characteristic of an analog test signal.

4. The oscilloscope according claim 1, wherein the plurality of datastreams include modulated signals.

5. The oscilloscope according claim 1, wherein the circuit is a power-supply unit or a high-frequency output unit.

6. An oscilloscope, comprising:
a plurality of analog/digital converters each measuring periodic signal values at different positions in a circuit;
a decimation unit that includes a plurality of inputs, each of the plurality of inputs receiving a datastream with a plurality of sampled values from the plurality of analog/digital converters, and includes a plurality of outputs corresponding to the plurality of inputs, each of the plurality of outputs outputting a reduced datastream corresponding to one of the plurality of analog/digital converters, the decimation unit being configured to:
calculate a root-mean-squared value in parallel from respectively at least two sampled values of each of the plurality of datastreams, and form each of the plurality of reduced datastreams from the root-mean-squared values;
an equalising filter connected between at least one of the plurality of analog/digital converters and the decimation unit, the equalising filter being configured to equalise each of the plurality of datastreams;
a recording unit configured to receive the plurality of reduced data streams, the recording unit including a visualisation unit that displays at least a portion of the plurality of reduced datastreams on a screen unit of the oscilloscope;
a trigger unit that compares the plurality of sampled values received from each of the plurality of analog/digital converters with a threshold value adjusted individually for each of the plurality of analog/digital converters, the trigger unit being configured to:
output a trigger signal to the recording unit when the trigger unit determines that a sampled value exceeds a corresponding threshold value,
wherein the screen unit displays the plurality of reduced datastreams based on the trigger signal; and
a low-pass filter connected between at least one of the plurality of analog/digital converters and the trigger unit, the low-pass filter being configured to band-limit a noise signal having a higher frequency than the plurality of datastreams,
wherein the decimation unit is configured to slow down a time basis so that the plurality of reduced datastreams can be directly visualised on the screen unit, and
wherein the decimation unit calculates the root-mean-squared values $u_{RMS}$ according to the formula:

$$u_{RMS}(k) = \sqrt{\frac{1}{D}\sum_{i=0}^{\frac{D-1}{n}}(u(k \cdot D + n \cdot i))^2}$$

with $$\frac{D-1}{n} \in \mathbb{N} \cap n > 1,$$

wherein
D=decimation factor,
k=decimation interval,
u=sampled value,
i=summation index, and
n=small decimation factor.

7. The oscilloscope according to claim 6, wherein the decimation unit takes into consideration adjusted values for an offset in the calculation of the root-mean-squared values.

8. The oscilloscope according to claim 6, wherein each of the plurality of datastreams reproduces a voltage characteristic or a current characteristic of an analog test signal.

9. A method for decimation of datastreams by an oscilloscope, the method comprising:
measuring, by a plurality of analog/digital converters, periodic signal values at different positions in a circuit;
receiving, by a plurality of inputs of a decimation unit, a plurality of datastreams, each with a plurality of sampled values from the plurality of analog/digital converters;
outputting, from a plurality of outputs of the decimation unit corresponding to the plurality of inputs, a reduced datastream corresponding to one of the plurality of analog/digital converters;

calculating, by the decimation unit, a root-mean-squared value in parallel from respectively at least two sampled values of each of the plurality of datastreams;

forming each of the plurality of reduced datastreams from the root-mean-squared values;

equalising, by an equalising filter connected between at least one of the plurality of analog/digital converters and the decimation unit, each of the plurality of datastreams;

receiving, by a recording unit, the plurality of reduced datastreams;

displaying on a screen unit of the oscilloscope, by a visualisation unit included in the recording unit, at least a portion of the plurality of reduced datastreams;

comparing, by a trigger unit, the plurality of sampled values received from each of the plurality of analog/digital converters with a threshold value adjusted individually for each of the plurality of analog/digital converters;

outputting a trigger signal, by the trigger unit, to the recording unit when the trigger unit determines that a sampled value exceeds a corresponding threshold value;

adjusting parameters selected from the group consisting of time range, voltage range, and a combination thereof;

band-limiting, by a low-pass filter connected between at least one of the plurality of analog/digital converters and the trigger unit, a noise signal having a higher frequency than the plurality of datastreams, wherein the screen unit displays the plurality of reduced datastreams accurately based on the trigger signal; and wherein the decimation unit is configured to slow down a time basis so that the plurality of reduced datastreams can be directly visualised on the screen unit, and wherein the root-mean-squared values $u_{RMS}$ is calculated according to the formula:

$$u_{RMS}(k) = \sqrt{\frac{1}{D}\sum_{i=0}^{D-1}(u(k \cdot D + i))^2},$$

wherein
D=decimation factor,
k=decimation interval,
u=sampled value, and
i=summation index.

10. The method according to claim 9, further comprising storing the plurality of reduced datastreams in an acquisition buffer unit.

11. The method according to claim 9, wherein each of the plurality of datastreams reproduces a voltage characteristic or a current characteristic of an analog test signal.

12. The method according to claim 9, wherein adjusted values for an offset are taken into consideration in the calculation of the root-mean-squared values by the decimation unit.

13. A method for decimation of datastreams by an oscilloscope, the method comprising:

measuring, by a plurality of analog/digital converters, periodic signal values at different positions in a circuit;

receiving, by a plurality of inputs of a decimation unit, a plurality of datastreams, each with a plurality of sampled values from the plurality of analog/digital converters;

outputting, from a plurality of outputs of the decimation unit corresponding to the plurality of inputs, a reduced datastream corresponding to one of the plurality of analog/digital converters;

calculating, by the decimation unit, a root-mean-squared value in parallel from respectively at least two sampled values of each of the plurality of datastreams;

forming each of the plurality of reduced datastreams from the root-mean-squared values;

equalising, by an equalising filter connected between at least one of the plurality of analog/digital converters and the decimation unit, each of the plurality of datastreams;

receiving, by a recording unit, the plurality of reduced datastreams;

displaying on a screen unit of the oscilloscope, by a visualisation unit included in the recording unit, at least a portion of the plurality of reduced datastreams;

comparing, by a trigger unit, the plurality of sampled values received from each of the plurality of analog/digital converters with a threshold value adjusted individually for each of the plurality of analog/digital converters;

outputting a trigger signal, by the trigger unit, to the recording unit when the trigger unit determines that a sampled value exceeds a corresponding threshold value;

adjusting parameters selected from the group consisting of time range, voltage range, and a combination thereof;

band-limiting, by a low-pass filter connected between at least one of the plurality of analog/digital converters and the trigger unit, a noise signal having a higher frequency than the plurality of datastreams, wherein the screen unit displays the plurality of reduced datastreams based on the trigger signal; and wherein the decimation unit is configured to slow down a time basis so that the plurality of reduced datastreams can be directly visualised on the screen unit, and wherein the root-mean-squared values $u_{RMS}$ is calculated according to the formula:

$$u_{RMS}(k) = \sqrt{\frac{1}{D}\sum_{i=0}^{\frac{D-1}{n}}(u(k \cdot D + n \cdot i))^2}$$

with $$\frac{D-1}{n} \in \mathbb{N} \cap n > 1,$$

wherein
D=decimation factor,
k=decimation interval,
u=sampled value,
i=summation index, and
n=small decimation factor.

14. The method according to claim 13, further comprising storing the plurality of reduced datastreams in an acquisition buffer unit.

15. The method according to claim 13, wherein each of the plurality of datastreams reproduces a voltage characteristic or a current characteristic of an analog test signal.

16. The method according to claim 13, wherein adjusted values for an offset are taken into consideration in the calculation of the root-mean-squared values by the decimation unit.

* * * * *